US012813234B2

(12) United States Patent
Lago et al.

(10) Patent No.: US 12,813,234 B2
(45) Date of Patent: Nov. 24, 2026

(54) HIGH VOLTAGE SEMICONDUCTOR DEVICE HAVING A DEEP TRENCH INSULATION AND MANUFACTURING PROCESS

(71) Applicant: STMicroelectronics S.r.l., Agrate Brianza (IT)

(72) Inventors: Emanuele Lago, Sesto San Giovanni, MI (US); Nunzia Malagnino, Monza (FR); Damiano Riccardi, Montevecchia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 370 days.

(21) Appl. No.: 18/520,894

(22) Filed: Nov. 28, 2023

(65) Prior Publication Data

US 2024/0178054 A1 May 30, 2024

(30) Foreign Application Priority Data

Nov. 30, 2022 (IT) ........................ 102022000024708

(51) Int. Cl.

*H10W 10/17* (2026.01)
*H10P 90/00* (2026.01)
*H10W 10/00* (2026.01)
*H10W 10/10* (2026.01)

(52) U.S. Cl.

CPC ......... *H10W 10/17* (2026.01); *H10P 90/1906* (2026.01); *H10W 10/014* (2026.01); *H10W 10/0143* (2026.01); *H10W 10/061* (2026.01); *H10W 10/181* (2026.01)

(58) Field of Classification Search

None

See application file for complete search history.

(56) References Cited

U.S. PATENT DOCUMENTS 8,053,897 B2 11/2011 Lerner
2011/0193193 A1* 8/2011 Dube .................... H10D 1/047 257/532

(Continued)

FOREIGN PATENT DOCUMENTS

CN 114695517 A 7/2022

OTHER PUBLICATIONS

IT Search Report and Written Opinion for priority application, IT Appl. No. 102022000024708, report dated Jun. 9, 2023, 9 pgs.

*Primary Examiner* — Bilkis Jahan
(74) *Attorney, Agent, or Firm* — Crowe & Dunlevy LLC

(57) ABSTRACT

A body of semiconductor material has a surface and accommodates an active area, conductive regions, a first deep insulation structure extending in the active area from the surface of the body in a first trench, and a second deep insulation structure extending in the active area from the surface of the body in a second trench and surrounding the conductive regions. The first deep insulation structure has insulation walls surrounding a conductive filling portion. The second deep insulation structure has a solid insulating region filling the second trench. The first deep insulation region has a first width and a first depth and the second deep insulation structure has a second width and a second depth. The second width is smaller than the first width and the second depth is smaller than the first depth.

10 Claims, 7 Drawing Sheets

(56) References Cited

U.S. PATENT DOCUMENTS

| | | | | |
|---|---|---|---|---|
| 2012/0139080 | A1* | 6/2012 | Wang | H10B 12/0387 257/532 |
| 2013/0147007 | A1* | 6/2013 | Booth, Jr. | H10B 12/0387 438/386 |
| 2013/0320459 | A1* | 12/2013 | Shue | H10D 62/115 438/296 |
| 2016/0163583 | A1* | 6/2016 | Liu | H10D 30/0281 438/430 |
| 2016/0163586 | A1* | 6/2016 | Siew | H10W 20/034 438/653 |
| 2018/0358257 | A1 | 12/2018 | Enda et al. | |
| 2021/0233819 | A1 | 7/2021 | Shih et al. | |

* cited by examiner

HIGH VOLTAGE SEMICONDUCTOR DEVICE HAVING A DEEP TRENCH INSULATION AND MANUFACTURING PROCESS

PRIORITY CLAIM

This application claims the priority benefit of Italian Application for Patent No. 102022000024708 filed on Nov. 30, 2022, the content of which is hereby incorporated by reference in its entirety to the maximum extent allowable by law.

TECHNICAL FIELD

The present invention relates to a high voltage semiconductor device having a deep trench insulation and a process for manufacturing such a high voltage semiconductor device.

BACKGROUND

As is known, for ensuring the insulation of high voltage devices, for example of devices manufactured using the Bipolar-CMOS-DMOS (BCD) High-Power technology, the so-called Deep Trench Insulation (DTI) technology is commonly used. This technology ensures the lateral insulation of the high voltage devices from the substrate and a lower area consumption compared to other types of electrical isolation, such as junction isolation. In addition, it provides a substrate plug, when desired.

In detail, in the DTI technology, the semiconductor region accommodating a power device is surrounded by an insulating structure formed in a deep annular trench. The trench has insulating walls, typically of oxide, and is filled with conductive material, typically polysilicon, that may be in direct electrical contact with the substrate, to ensure electrical connection (substrate plug). Conductive regions of the power device are formed in the area surrounded by the insulating structure, at a distance depending on the operating voltage.

With reference to FIGS. 1 and 2, for example, a device 1 designed to operate at high voltage and having a deep trench insulation according to the above technology is shown.

Here, a body 2 of semiconductor material, such as silicon, accommodates conductive and insulating regions. The body 2 has a (upper or top) surface 2A.

For example, in FIG. 2 the body 2 comprises a substrate 3; a first epitaxial layer 4, superposed to the substrate 3; and a second epitaxial layer 5, superposed to the first epitaxial layer.

A deep trench insulation (DTI) 10 surrounds a portion, indicated by 9, of the body 2.

The DTI 10 extends from the surface 2A of the body 2 through the second epitaxial layer 5 and the first epitaxial layer 4 until reaching into the substrate 3. As visible in FIG. 1, the DTI 10 has a closed shape, annular, here approximately quadrangular, however other shapes are possible.

The DTI 10 is formed in a trench 11 whose sidewalls are covered by insulating wall regions 12, for example of silicon dioxide, and is filled with conductive material 13, for example polysilicon.

The conductive material 13 is in direct electrical contact with the substrate 3; for example, the bottom portion of the DTI 10 extends into the substrate 3 and the conductive material 13 contacts the substrate 3 at a bottom surface of the conductive material 13. The DTI 10 thus acts as a substrate plug.

A thick insulation 15 extends on the surface 2A of the body 2. Thick insulation 15 is, for example, formed by a thermally grown oxide, in a per se known manner. The thick insulation 15 is here merged with the wall regions 12 of the DTI 10 and is opened at contact areas of the portion 9 of the body 2, here a first contact area 17, a second contact area 18 and a third contact area 19, over an active area 16. Of course, the illustrated layout is only an example of many possibilities, and the actual layout may be designed according to the specific requirements, as obvious to the person skilled in the art. For example, conductive implanted regions may be provided in the active area 16, below the contact areas 17-19, in a manner not shown.

In FIG. 2, an implanted region 20 extends in the body 2, buried below surface 2A, here at the interface between the first epitaxial layer 4 and the second epitaxial layer 5, in the active area 16. Implanted region 20 is only indicative of any buried region formed in the body 2 in the active area 16; in each device, its shape, depth, thickness, area and conductivity are selected according to the desired design.

For example, the substrate 3 may be of $P^{++}$ type; first and second epitaxial layers 4, 5 are of P type and the implanted region 20 may be of N type. Implanted region 20 may have antimony Sb or arsenic As ions implanted therein.

A polysilicon layer 21 extends on the surface 2A of the body. For example, the polysilicon layer 21 may form gate regions of MOS components, electrical lines, capacitor plates, and so on, as known in the art.

In FIGS. 1, 2, the polysilicon layer 21 forms a poly region 21A extending partly on the thick insulation 15 and partly on the first contact area 17 and has an aperture 22 on the first contact area 17. For example, poly region 21A may form a gate region of an MOS device; in this case, a thin oxide gate layer (not shown) may extend between the poly region 21A and the first contact area 17.

A metal layer 23 extends generally on a higher level than the polysilicon layer 21, for electrical contact. Metal layer 23 has not been shown in FIG. 1 for sake of clarity.

For example, here, metal layer 23 includes a metal region in direct electrical contact with the first contact area 17 through the aperture 22 of the polysilicon layer 21. As known to the person skilled in the art, the material, shape and geometrical features of the metal layer 23 are selected according to the desired project and other metal layers may extend on different, upper levels.

In device 10, when designed to operate at high voltages, higher than 70 V for example, distances between the various regions and their dimensions are accurately studied to avoid device failure.

In fact, the device isolation voltage capability depends on the thickness of the insulating regions and on the distance between the insulations and the conductive regions (e.g., implanted region 20). In particular, the thickness of the insulating wall regions 12 is important.

For example, in a current technology, the first epitaxial layer 4 may have a depth of about 15 μm and the second epitaxial layer 5 may have a depth of about 4 μm.

For withstanding high voltages (higher than 70 V), the DTI 10 may have a total thickness CD (FIG. 2) of about 2-3 μm and the wall regions 11 may have a wall thickness WT of about 0.8 μm. In this configuration, the minimum distance between the DTI and the implanted region 20 is generally 10 μm. A vertical depth of the DTI 10 may be about 27 μm.

In general, the DTI geometrical features are fixed according to technology requirements in order to have the desired wall thickness WT of the wall regions 11 and to contact the substrate 3. To increase isolation voltage capability, the design is to be changed accordingly, increasing the total thickness CD and/or the wall thickness WT.

If it is desired to have different isolation capabilities, separate structures are to be manufactured and integrated separately. For example, it is possible to integrate more than one DTI with different functions and insulation capabilities in a same integrated circuit chip, but they are to be integrated using different masks and using separated integration steps, with high manufacturing costs. In fact, fabrication of the trenches 11 involves numerous etching, and, in case of very deep trenches, is very expensive. Manufacture of trenches with different characteristics would involve a multiplication of costs.

Multiple concentrical insulations structures have also been suggested, having different dimensions (different total thickness CD and/or different wall thickness WT), but manufacture of multiple DTIs is problematic. In fact, when opening a deep DTI to create a substrate contact, it may happen that the smaller/shallower DTI trench is a bit wider than expected due to manufacturing variability; therefore, there is a risk to reduce the oxide lining of the smaller DTI, jeopardizing voltage breakdown.

Thus, there is a need to overcome the drawbacks and limitations of the prior art.

SUMMARY

In an embodiment, a high voltage semiconductor device and a manufacturing process thereof are provided.

In an embodiment, a high-voltage semiconductor device comprises: a body of semiconductor material having a surface; an active area in the semiconductor body; an operational region in the active area; a first deep insulation structure extending in the active area from the surface of the body in a first trench and comprising insulation walls surrounding a conductive filling portion, the first deep insulation region having a first width and a first depth; and a second deep insulation structure, extending in the active area from the surface of the body in a second trench and surrounding the operational region, the second deep insulation structure comprising a solid insulating region filling the second trench, the second deep insulation structure having a second width and a second depth, the second width being smaller than the first width and the second depth being smaller than the first depth.

In an embodiment, a process for manufacturing a high-voltage semiconductor device as described above comprises: simultaneously forming a first and a second trench, the first and second trenches extending from a surface of a body of semiconductor material, the first trench having a greater depth and a greater width than the second trench; simultaneously forming insulation walls on sidewalls of the first trench and a solid insulating region in the second trench, the insulation walls defining an empty space between them and the solid insulating region filling the second trench; and filling the empty space in the first trench with a conductive filling material, thereby forming a first insulation structure; the solid insulating region in the second trench defining a second insulation structure.

BRIEF DESCRIPTION OF THE DRAWINGS

For the understanding of the present invention, embodiments thereof are now described, purely as a non-limitative example, with reference to the enclosed drawings, wherein.

DETAILED DESCRIPTION

Figure 1:
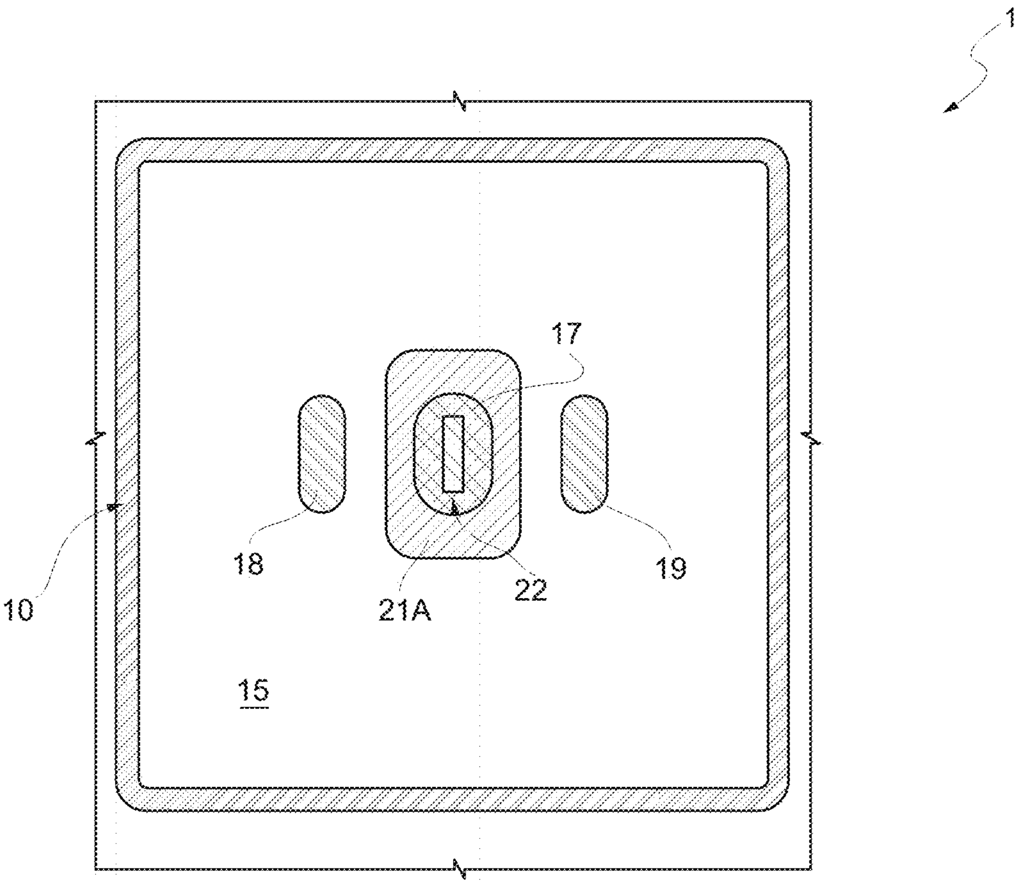
FIG. 1 is a top plan view of a high voltage semiconductor device.

The following description refers to the arrangement shown in the drawings; consequently, expressions such as "above", "below", "upper", "lower", "top", "bottom", "right", "left" and the like are relative to the attached Figures and should not be interpreted in a limiting way.

Figure 3:
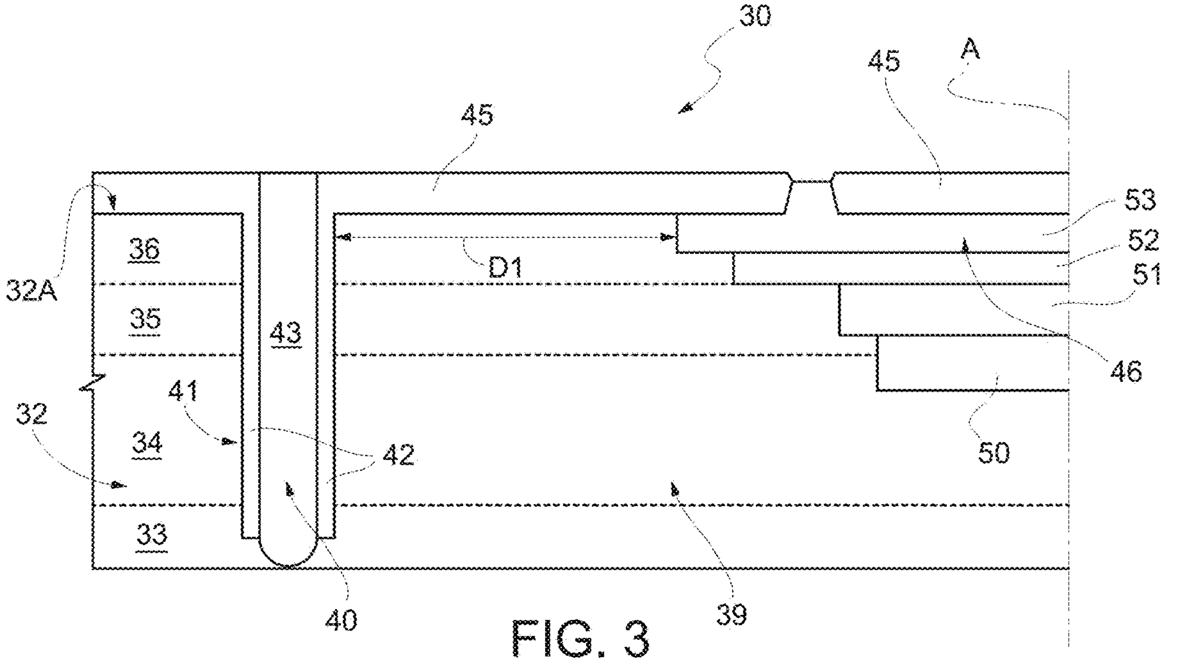
FIG. 3 is a cross-sectional view of another high voltage semiconductor device.

FIG. 3 shows a portion of a device 30 manufactured according to the DTI technology. FIG. 3 shows only half of the device 30; the complete device 30 may be obtained by turning (i.e., mirroring) FIG. 3 about a central axis A, although the structure does not need to be symmetric.

Here, a body 32 of semiconductor material, such as silicon, has a (top or upper) surface 32A and comprises a substrate 33; a first epitaxial layer 34, superposed to the substrate 33; a second epitaxial layer 35, superposed to the first epitaxial layer 34; and a third epitaxial layer 36, superposed to the second epitaxial layer 35. However, a single epitaxial layer or multiple epitaxial layers may be provided.

A deep trench insulation (DTI) 40 surrounds a portion, indicated by 39, of the body 32. In FIG. 3, only a left portion of the DTI 40 is visible.

The DTI 40 extends from the surface 32A of the body 32 through the third epitaxial layer 36, second epitaxial layer 35, and first epitaxial layer 34 until reaching into the substrate 33. The DTI 40 has a closed shape, annular, for example the quadrangular shape of FIG. 2, however other shapes are possible.

The DTI 40 is formed in a trench 41 whose sidewalls are covered by insulating wall regions 42, for example of silicon dioxide, and is filled with conductive material 43, for example polysilicon.

The conductive material 43 is in direct electrical contact with the substrate 33; for example the bottom portion of the DTI 40 extends into the substrate 33 and the conductive material 43 contacts the substrate 33 at the bottom portion of conductive material 43. The conductive material 43 thus acts as a substrate plug.

A thick insulation 45 extends on the surface 42A of the body 42. Thick insulation 45 is, for example, formed by a thermally grown oxide, in a per se known manner. The thick insulation 45 is here merged with the wall regions 42 of the DTI 40 and is opened at a contact area in an active area 46 of the body 42.

In FIG. 3, a plurality of implanted regions 50-53 extend in the body 32. For example, here a deep buried region 50 extends at the interface between the first epitaxial layer 34 and the second epitaxial layer 35, in the active area 46; a buried region 51 extends on the deep buried region 50, in the second epitaxial layer 35; an isolation region 52 extends on the buried region 51, at the interface between the second epitaxial layer 35 and the third epitaxial layer 36; and a well high voltage region 53 extends on the isolating region 52, in the third epitaxial layer 36.

In FIG. 3, implanted regions 50-53 have increasing width, starting from the deep buried region 50, and generally have different doping levels (N-type, for a substrate 33 of $P^{++}$ type), but dimensions and doping levels may be varied according to the design, desired electrical features and manufacturing technology, as clear to the person skilled in the art.

Figure 2:
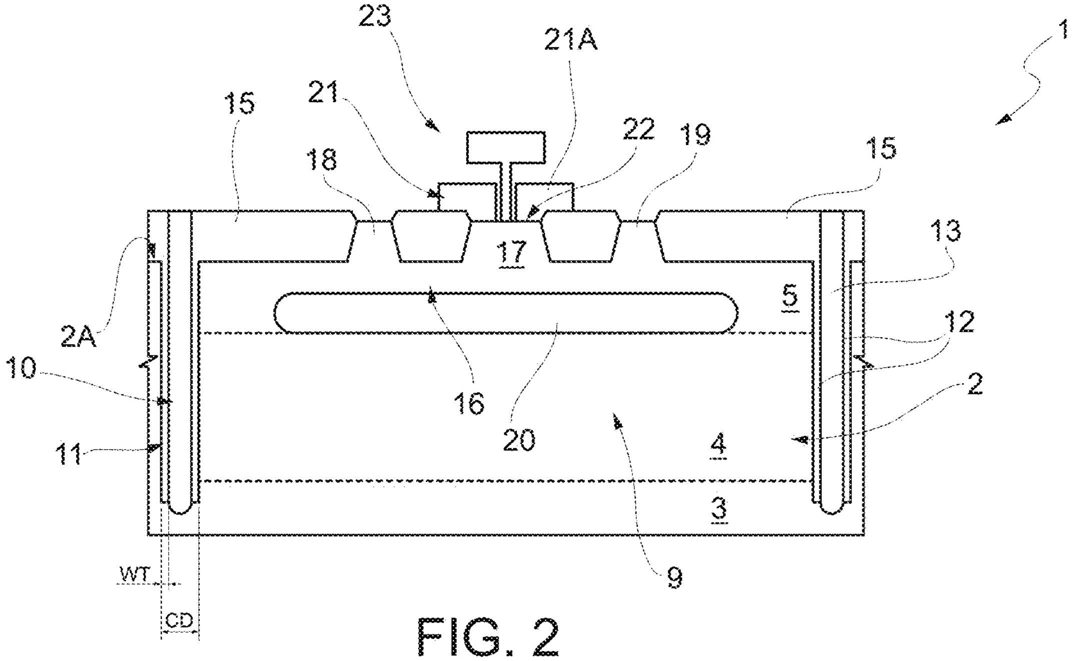
FIG. 2 is a cross-sectional view of the device of FIG. 1.

Various conductive and insulating regions (not shown) may extend on the surface 32A of the body 32, as also discussed with reference to FIGS. 1 and 2.

Implanted regions 50-53 may be arranged at different distances from DTI 40. Presently, in a high-voltage application and in a current technology, in order to withstand a voltage higher than 70 V, a distance D1 between a largest implanted region (here the well high voltage region 53) and the DTI 40 may be about 10 μm.

Figure 4:
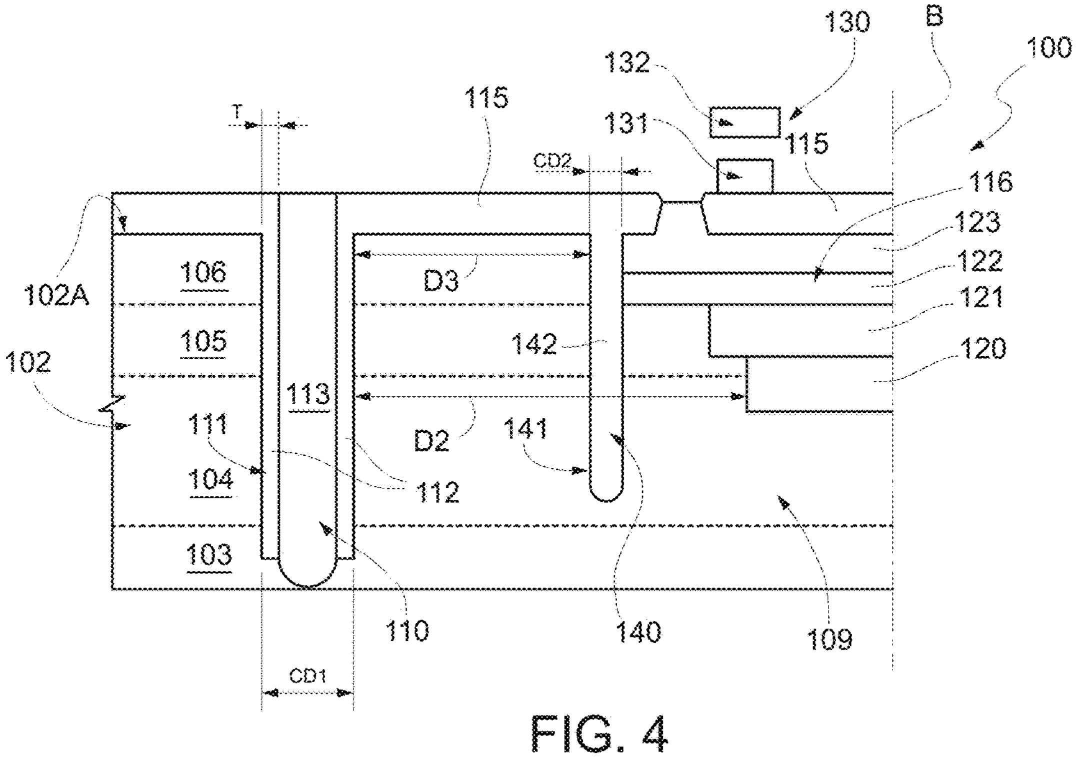
FIG. 4 is a cross-sectional view of a high voltage semiconductor device, according to an embodiment.

FIG. 4 shows a portion of a device 100 manufactured according to the present disclosure. FIG. 4 shows only half of the device 100; the complete device 100 may be obtained by turning (i.e., mirroring) FIG. 4 about a central axis B (as for example visible in the top view of FIG. 5), although the structure does not need to be symmetric.

Here, a body 102 of semiconductor material, such as silicon, has a (top or upper) surface 102A and comprises a substrate 103; a first epitaxial layer 104, superposed to the substrate 103; a second epitaxial layer 105, superposed to the first epitaxial layer 104; and a third epitaxial layer 106, superposed to the second epitaxial layer 105. However, a single epitaxial layer or multiple epitaxial layers may be provided.

A first deep trench insulation (DTI) 110 surrounds a body portion, indicated by 109, of the body 102. In FIG. 4, only half (left) portions of the first DTI 110 and of body portion 109 are visible.

The first DTI 110 extends from the surface 102A of the body 102 through the third epitaxial layer 106, second epitaxial layer 105 and first epitaxial layer 104 until reaching into the substrate 103. The first DTI 110 has a closed shape, annular, for example a quadrangular shape, as visible in the top plan view of FIG. 5, however other shapes are possible.

The first DTI 110 is formed in a first trench 111 and comprises wall regions 112 and conductive material 113. The wall regions 112 cover the sidewalls of the first trench 111 and are, for example, of silicon dioxide. Conductive material 113 is for example polysilicon.

The conductive material 113 is in direct electrical contact with the substrate 103; for example, the bottom portion of the first DTI 110 extends into the substrate 103 and the conductive material 113 contacts the substrate 103 at a bottom surface of the conductive material 113. The conductive material 113 thus acts as a substrate plug, at ground voltage.

A thick insulation 115 extends on the surface 102A of the body 102. Thick insulation 115 is formed, for example, by an oxide, in a per se known manner. The thick insulation 115 is here merged with the wall regions 112 of the first DTI 110. The active area insulation 115A is opened at a contact area in an active area 116 of the body 112. Other apertures may be provided for electrical contact to the body 2, according to the specific design and requirements, as obvious to the person skilled in the art.

In FIG. 4, a plurality of implanted regions 120-123 extend in the body 102. For example, here a deep buried region 120 extends at the interface between the first epitaxial layer 104 and the second epitaxial layer 105, in the active area 116; a buried region 121 extends on the deep buried region 120, in the second epitaxial layer 104; an isolation region 122 extends on the buried region 121, at the interface between the second epitaxial layer 105 and the third epitaxial layer 106; and a well region 123 extends on the isolation region 122, in the third epitaxial layer 106.

Well region 123 may be configured to operate, at least in some operational conditions, at a very high voltage, for example, at more than 70V, and may be an operational region configured to operate at the highest voltage with respect to ground (conductive material 113).

However, the illustrated sequence and number of layers is only an example of many possibilities and the actual implementation depends on specific requirements, as obvious to the person skilled in the art.

In FIG. 4, implanted regions 120-123 have different widths and may have increasing doping levels (N-type, for a substrate 103 of $P^{++}$ type), but dimensions and doping levels may be varied according to the design, desired electrical features and manufacturing technology, as clear to the person skilled in the art.

Surface structures 130 extend on the surface 102A of the body 102. Surface structures 130 may be various conductive and insulating regions (represented here only schematically by a polysilicon layer 131 and a metal layer 132; insulating regions and layers may be present, as well). For example, polysilicon layer 131 may extend on the thick insulation 115 and/or on the body surface 102A (in case, generally insulated by a thin oxide layer, not shown) and may form gate regions of MOS components, electrical lines, capacitor plates, and so on, as known in the art. Metal layer 132 may comprise metal regions in direct electrical contact with the implanted regions 120-123 and may have different layout according to the desired project. Many metal layers may extend on different, upper levels.

Figure 5:
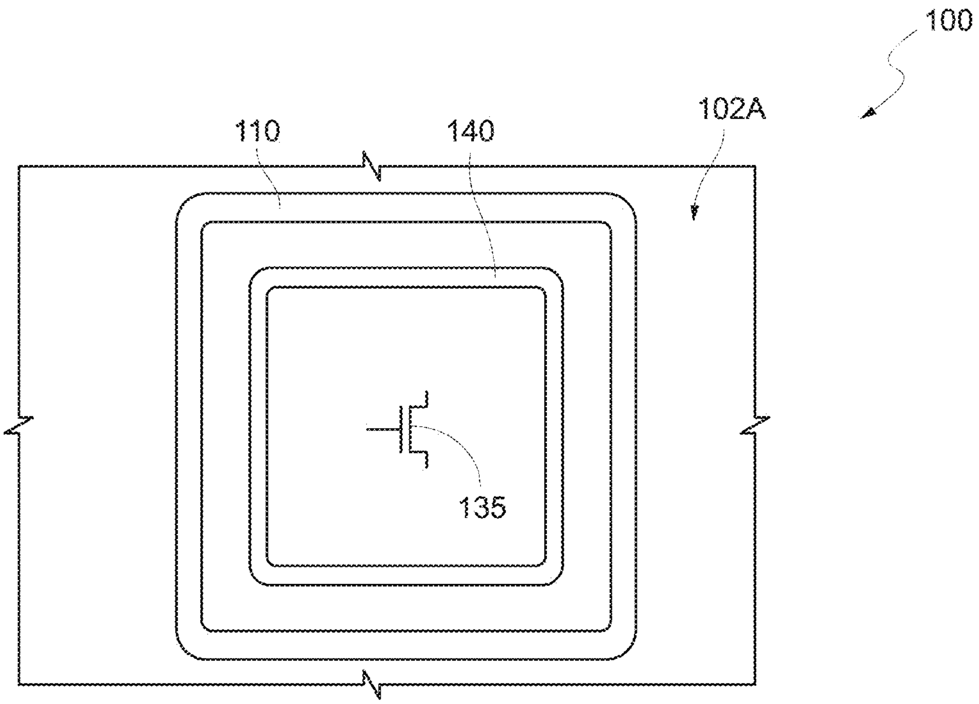
FIG. 5 is a top plan view of the high voltage semiconductor device of FIG. 4.

Implanted regions 120-123 and surface structures 130 form various electronic components, as represented schematically and by way of example in FIG. 5 by a MOS transistor 135.

A second deep trench insulation (second DTI) 140 extends into the body 102. The second DTI 140 is smaller than the first DTI 110; in particular it has a smaller depth and a smaller thickness.

The second DTI 140 is formed in a second trench 141 which is completely filled by a solid insulating region 142 of insulating material, for example silicon dioxide.

The second DTI 140 surrounds the active area 116 of the device 100; therefore it annularly surrounds the implanted regions 120-123. In the shown embodiment, the second DTI 140 is contiguous to (in contact with) the peripheral edges of both isolation region 122 and well high voltage region 123. In general, it is advantageous that the second DTI 140 is contiguous to any largest implanted region 120-123, to reduce the overall rail area of the device isolation and thus of the device 100 itself.

In FIG. 4, the second DTI 140 is annularly surrounded at a distance by the first DTI 110, as clearly visible in FIG. 5.

As discussed later on, the first and the second DTIs 110 and 140 are formed in the same manufacturing steps. To this end, by indicating with CD1 the total thickness of the first DTI 110 and with CD2 the thickness of the second DTI 140, the following relationship applies: CD2<CD1. In particular, by indicating with T the thickness of wall regions 112, the following relationship applies: CD2≤2T.

FIG. 4 also shows some possible distances and dimensions of the implanted regions 120-123. For example, in the proposed solution for a current technology intended to withstand at least 70 V, a distance D2 between the deep buried region 120 and the first DTI 110 can be reduced from 10 μm to less than 5 μm, while a distance D3 between the first and the second DTIs 110, 140 may be about 3 μm.

The total thickness CD1 of the first DTI 110 may be about 3 μm, the thickness CD2 of the second DTI 140 may be about 1.6 μm and the thickness T of wall regions 112 may be about 0.8 μm.

In addition, the depth of the first DTI 110 may be about 27 μm and the depth of the second DTI 140 may be about 20 μm.

Therefore, the minimum distance between the implanted region that is nearest to the first DTI 110 (here, both isolation region 122 and well high voltage region 123) is considerably reduced compared to device 30 of FIG. 3, thus allowing a considerable reduction in the dimensions of device 100.

Figure 6:
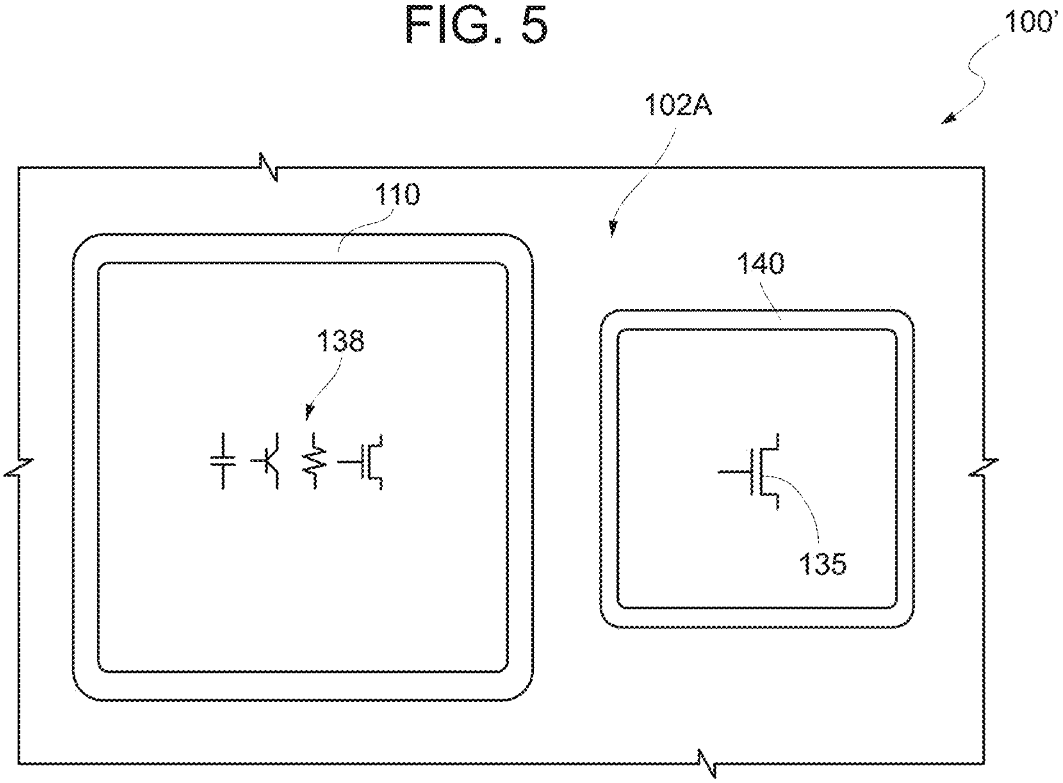
FIG. 6 is a top plan view of another layout of the present high voltage semiconductor device.

In other embodiments, see device 100' of FIG. 6, the first DTI does not surround the second DTI. This may be the case, for example, when other components with lower voltage withstanding necessities, represented schematically in FIG. 6 by generic electrical components 138, require a plug to the substrate 103. In this case, the first DTI, identified again by reference number 110, surrounds generic electrical components 138 and the second DTI, also identified again by reference number 140, surrounds MOS transistor 135.

Arrangement of a second, smaller DTI allows a reduction in the overall area of the high voltage device. For example, for a current technology with the above indicated dimensions, the device 100 of FIGS. 4 and 5 may have an area reduction, with respect to device 30 of FIG. 3 in the same technology, of 40%, maintaining the same voltage capabilities, up to about 150 V. The device 100' of FIG. 6 may reach a reduction, in the rail area of second DTI 140, of even 70%.

The first and second DTIs 110, 140 of devices 100, 100' may be manufactured in a single step, using a standard process, thus at substantially the same cost as for the device 30 of FIG. 3.

For example, FIG. 7A-7G show an exemplary process to manufacture device 100.

Figure 7A:
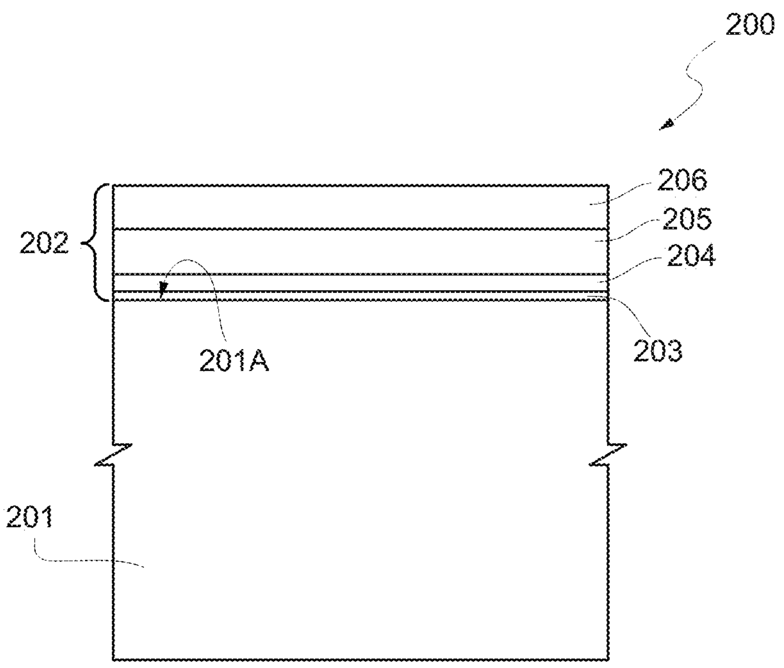
FIGS. 7A-7G are cross-sections of a portion of a semiconductor wafer in subsequent manufacturing steps for fabricating the high voltage semiconductor device of FIGS. 4 and 5.

With initial reference to FIG. 7A, a wafer 200 includes a wafer body 201, intended to form body 2 of FIG. 4. Wafer body 201 is of semiconductor material, for example monocrystalline silicon, may comprise one or more layers, for example a substrate and a plurality of epitaxial layers, as described with reference to FIG. 4, and has a main surface 201A.

An insulating stack 202 is formed on the main surface 201A of the wafer body 201. For example, in FIG. 7A, the insulating stack 202 is a four-layer stack and comprises a first layer 203, made of silicon oxide; a second layer 204, made of silicon nitride; a third layer 205, made of polysilicon; and a fourth layer 206, made of silicon oxide.

The insulating stack 202 may have an overall thickness of about 2 μm.

Figure 7B:
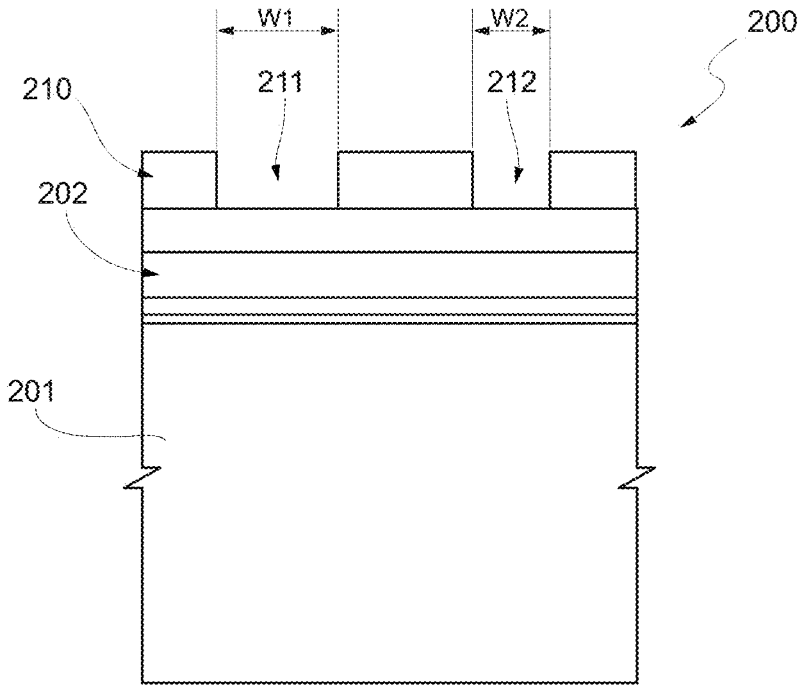

In FIG. 7B a mask 210, for example a resist mask, is formed. Mask 210 has a first aperture 211 and a second aperture 212. The first aperture 211 is larger than the second aperture 212. For example, the width W1 of the first aperture 211 may be about 2 μm and the width W2 of the second aperture 212 may be about 0.8 μm.

Figure 7C:
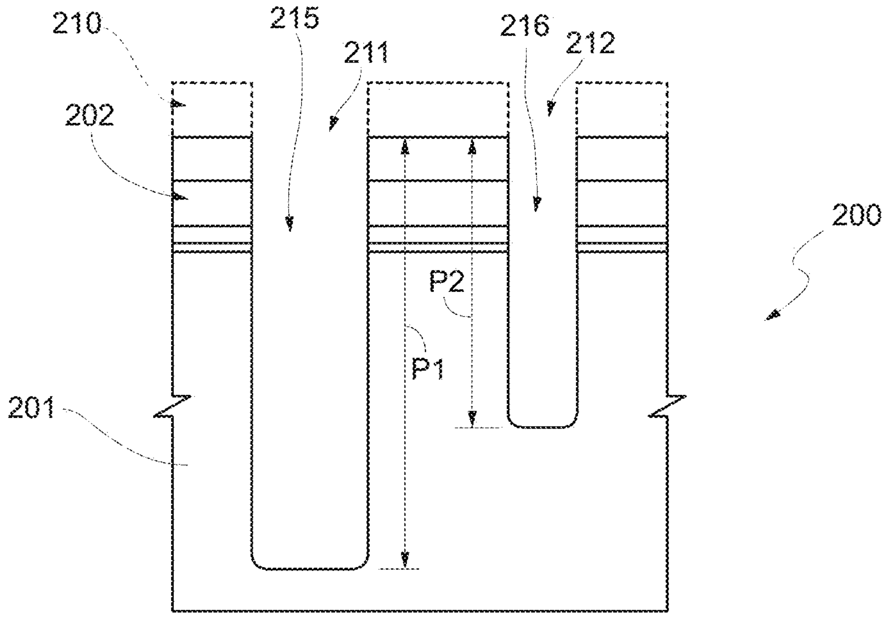

In FIG. 7C the wafer 200 is etched using mask 210. During etching, uncovered portions of the stack 202 and of the wafer body 201 are removed, forming a first trench 215 under the first aperture 211 and a second trench 216 under the second aperture 212. Due to the larger width of the first aperture 211, the first trench 215 is larger than the second trench 216 and etching at the first aperture 211 is deeper than at the second aperture 212; therefore first trench 215 is deeper and larger than the second trench 216.

For example, the first trench 215 may have a depth P1 of about 27 μm and the second trench 216 may have a depth P2 of about 20 μm.

Trenches 215, 216 have a closed, annular, shape in top plan view; for example, they may have the shape shown in FIG. 5.

Then, the mask 210 is removed, e.g., stripped.

Figure 7D:
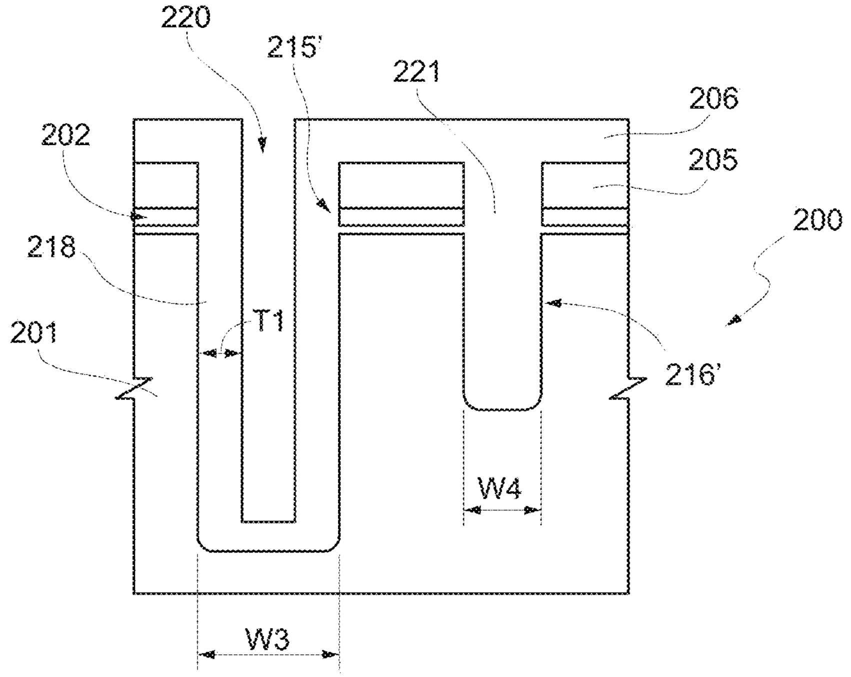

In FIG. 7D, an oxide layer is grown on the sidewall of the openings 215, 216. For example, thermal oxidation is performed, by introducing the wafer 200 in an oven at about 1100° C., in wet atmosphere. In this situation, uncovered portions of the wafer body 201, of silicon, are oxidized.

Oxidation is continued until a desired thickness of oxide is obtained. In particular, oxidation is continued until a lateral wall 218 of a preset thickness is formed along the sidewalls and the bottom of the first trench (now identified as first trench 215', as explained below). An empty space 220 remains in the first trench 215', surrounded by the lateral wall 218. In addition, dimensions are selected so that the second trench (now identified as second trench 216') is completely filled by the growing oxide, that forms an insulation structure 221. It is noted that, as known to the person skilled in the art, due to the silicon consummation during oxidation, the first trench 215' (whose surface is covered by the lateral walls 218) and the second trench 216' have larger dimensions than the first and second trenches 215, 216 as etched.

For example, lateral wall 218 may have a thickness T1 of about 0.8 μm; the first trench 215' may have a width W3 of about 3 μm; and the second trench 216' (and insulation structure 221) may have a width (thickness) W4 of about 1.6 μm.

Figure 7E:
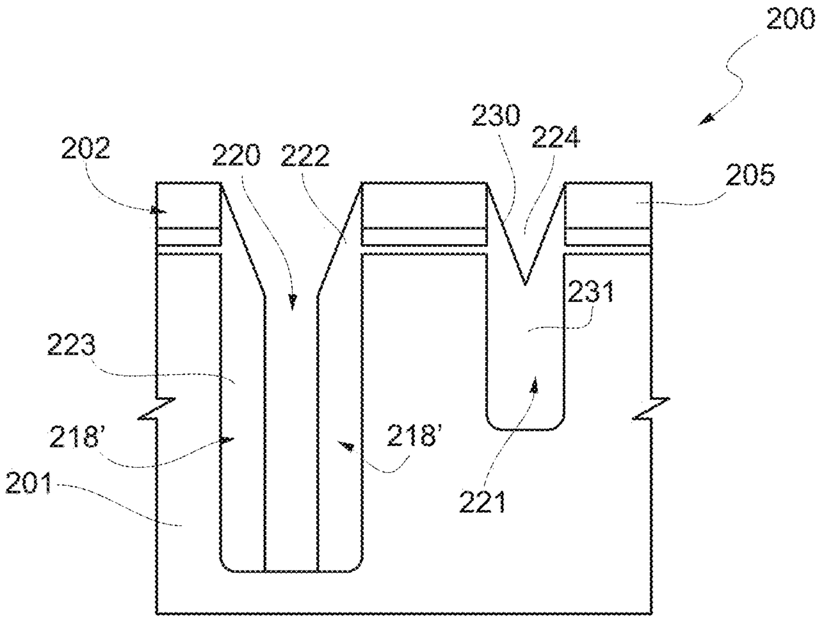

In FIG. 7E, an oxide etching is performed, for example dry etching. Consequently, the fourth layer 206 of the stack 202 is completely removed; the bottom portion of the lateral wall 218 is completely removed, thereby the two sidewalls (identified by reference number 218') of the lateral wall 218 are no more connected; the upper portions of the sidewalls 218' are anisotropically etched, forming slanted inlet portions 222 overlying respective vertical portions 223; and the upper portion of the insulation structure 221 is anisotropically etched, forming a slanted cavity 224 laterally surrounded by a top portion 230 of the insulation structure 221. The top portion 230 of the insulation structure 221 overlies a solid oxide portion 231.

Figure 7F:
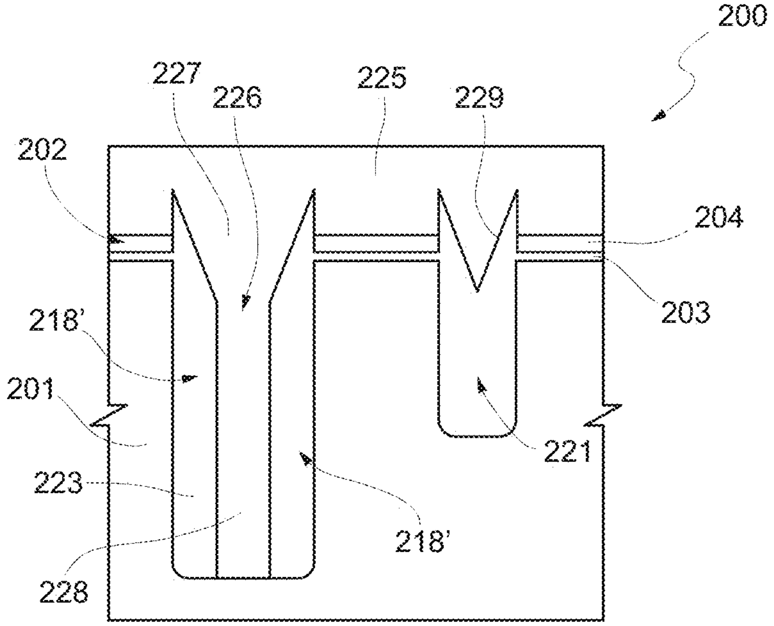

In FIG. 7F, a polysilicon layer 225 is deposited. The polysilicon layer 225 (which is undistinguishable from the third layer 205, FIG. 7E) has a thickness sufficient to fill the empty space 220 in the first trench 215', including the space at the slanted inlet portions 222 of the sidewalls 218', and to fill the space at the slanted cavity 224 of the second trench 216'.

In particular, at the first trench 215', the polysilicon layer 225 is in direct contact with the wafer body 201.

The portion of the polysilicon layer 225 filling the empty space 220 in the first trench 215' is indicated as trench filling portion 226. Trench filling portion 226 here comprises a superficial portion 227 at the slanted inlet portions 222 of the sidewalls 218' and a deep portion 228 extending from the superficial portion 227 to the bottom of the first trench 215'.

The portion of the polysilicon layer 225 filling the slanted cavity 224 is indicated as top filling portion 229.

Figure 7G:
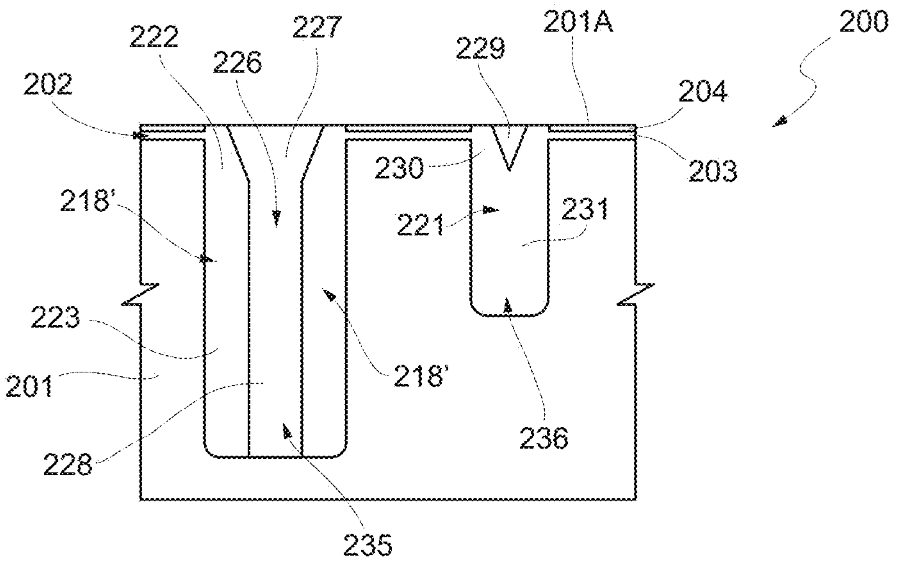

In FIG. 7G, the polysilicon layer 225 is completely removed from the surface of the wafer 200, for example through CMP (Chemical-Mechanical Polishing), stopping at the second layer 204 of the stack 202, thus reducing the depth of but not eliminating the superficial portion 227 of the trench filling portion 226 in the first trench 215' and the top filling portion 229 in the second trench 216'.

In practice, the sidewalls 218' and the trench filling portion 226 form a first DTI 235 and the insulation structure 221 and the top filling portion 229 form a second DTI 236.

In the first DTI 235, the slanted inlet portions 222 of the lateral walls 218' have increasing thickness starting from the main surface 201A of the wafer body 201, and the vertical portions 223 have approximately uniform thickness. The slanted inlet portions 222 of the lateral walls 218' surround the superficial portion 227 of the trench filling portion 226 and the vertical portion 223 of the lateral walls 218' surrounds the deep portion 228 of the trench filling portion 226.

In the second DTI 236, the top filling portion 229 has a triangular section with a base approximately at the main surface 201A of the wafer body 201 and decreasing cross-section toward the bottom of the second trench 216'; in addition, as above indicated, the top portion 230 of the insulation structure 221 overlies the solid insulating portion 231 of oxide.

Then, further manufacturing steps may be carried out in a manner known to the person skilled in the art, including forming a thick insulation on the surface of the wafer body 201 as well forming as electronic components in and above the wafer body 201; dicing the wafer 200, for obtaining for example device 100 of FIGS. 4 and 5.

Figure 8:
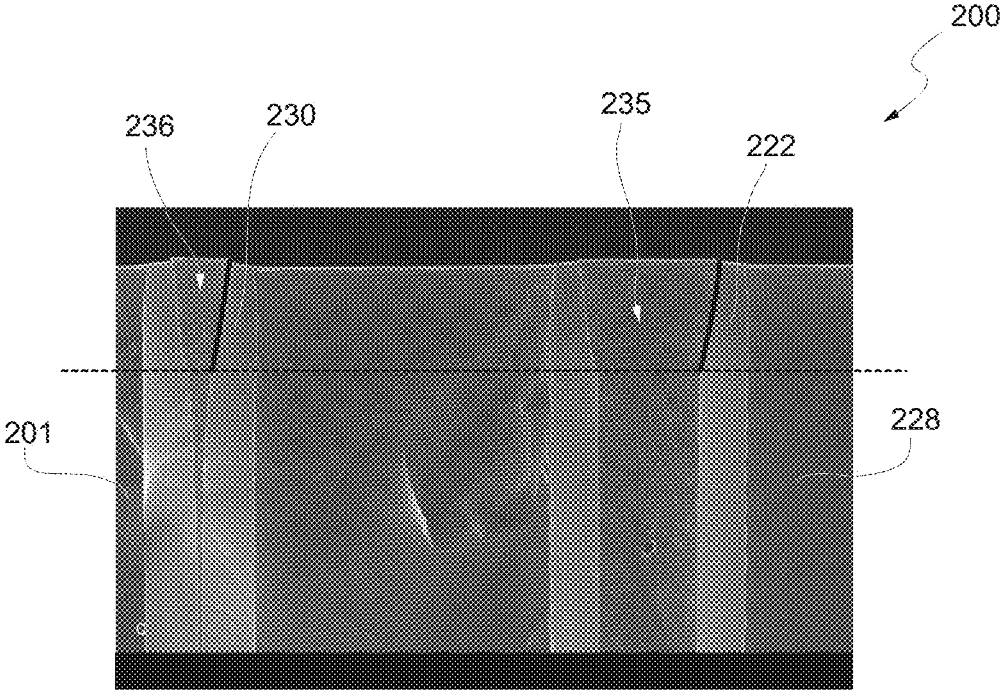
FIG. 8 is a SEM image of an enlarged portion of the high voltage semiconductor device of FIGS. 4 and 5.

With the process of FIG. 7A-7G it is thus possible to manufacture the first and the second DTIs 110, 140 of FIG. 4 with different geometries in same manufacturing steps, only with modification of mask layout and without any modification to the existing process flow. FIG. 8 shows a SEM image of a portion of wafer 200 after the oxide etching step of FIG. 7E.

In particular, FIG. 8 shows the first and the second trenches 215', 216' after being filled by the trench filling portion 226 and by the top filling portion 229.

FIG. 8 highlights the profile of one of the slanted inlet portions 222 of the first DTI 235 and the profile of one of the facing sides of the top portion 230 of the second DTI 236. As visible, due to the common etching step discussed above with reference to FIG. 7E, such profiles are about the same and the depth of the slanted inlet portions 222 (and thus of the superficial portion 227, not visible in FIG. 8) are also about the same as the depth of the top portion 230 of the second DTI 236 (and thus of the top filling portion 229, not visible in FIG. 8).

Finally, it is clear that numerous variations and modifications may be made to the device and the process described and illustrated herein, all falling within the scope of the invention as defined in the attached claims.

Summarizing, the present disclosure includes the following examples.

Example 1. A high-voltage semiconductor device (100, 200) comprising: a body (102; 201) of semiconductor material having a surface (102A; 201A); an active area (116) in the semiconductor body; an operational region (120-123) in the active area; a first deep insulation structure (140; 236) extending in the active area from the surface of the body in a first trench (111; 215') and comprising insulation walls (112; 118') surrounding a conductive filling portion (113; 226), the first deep insulation region having a first width (CD1; W3) and a first depth (P1); and a second deep insulation structure (140; 236), extending in the active area from the surface of the body in a second trench (141; 216') and surrounding the operational region (120-123), the second deep insulation structure (140; 236) comprising a solid insulating region (142; 221) filling the second trench (141; 216'), the second deep insulation structure having a second width (CD2; W4) and a second depth (P2), the second width (CD2; W4) being smaller than the first width (CD1; W3) and the second depth (P2) being smaller than the first depth (P1).

Sub-example 1. The operational region may be configured to operate, at least in some operational conditions, at a very high voltage.

Sub-example 2. The operational region may be configured to operate, at least in some operational conditions, at the highest voltage of the device, referred to a voltage of the conductive filling portion of the first deep insulation structure (140; 236).

Sub-example 3. The second deep insulation structure (140; 236) may be contiguous to the operational region (120-123).

Sub-example 4. The operational region (123) may be a first operational region of a plurality of superposed operational regions (120-123) extending in the active area (116) and the first operational region (123) may be the largest region among the plurality of operational regions.

Example 2. A high-voltage semiconductor device according to Example 1, wherein the first deep insulation structure (140; 236) extends on a closed line and surrounds the second deep insulation structure (140; 236).

Example 3. A high-voltage semiconductor device according to Example 1, wherein the second deep insulation structure (140; 236) extends on a closed line and the first deep insulation structure (140; 236) is external to the second deep insulation structure.

Example 4. A high-voltage semiconductor device according to any of the preceding Examples, wherein the insulation walls (112; 118') of the first deep insulation structure (140; 236) are open at the bottom and the conductive filling portion (113; 226) is in direct contact with the semiconductor material of the body (102; 201).

Example 5. A high-voltage semiconductor device according to any of the preceding Examples, wherein the insulation walls (218') of the first deep insulation structure (110; 235) have each a first portion (222) that is slanted and overlies a second portion (223); the first portions (222) of the insulation walls (218') surrounding a superficial portion (227) of the conductive filling portion (226); the second portion (223) of the insulation walls (218') surrounding deep portion (228) of the trench filling portion (226); the second deep insulation structure (140; 236) has a surface portion (230) overlying the solid insulating region (231); the surface portion (230) of the second deep insulation structure delimiting a superficial cavity (224) accommodating a top filling portion (229) of conductive material.

Example 6. A high-voltage semiconductor device according to the preceding Example, wherein the first portions (222) of the insulation walls (218') have increasing thickness starting from the main surface (201A) of the body (201) and the top filling portion (229) of the second deep insulation structure (235) has a triangular section with a base at approximately the main surface (201A) of the body (201).

Example 7. A high-voltage semiconductor device according to the Example 5 or 6, wherein the surface portion (230) of the second deep insulation structure (236) has two facing sides and each first portion (222) of the insulation walls (218') has approximately a same profile as one of the facing sides of surface portion (230) of the second deep insulation structure (236).

Example 8. A high-voltage semiconductor device according to any of the preceding Examples, wherein the second width (CD2; W4) is lower than half of the first width (CD1; W3).

Example 9. A process for manufacturing a high-voltage semiconductor device according to any of the preceding Examples, comprising: simultaneously forming a first and a second trench (111, 141; 215, 216), the first and second trenches extending from a surface (102A; 201A) of a body (102; 201) of semiconductor material, the first trench having a greater depth and a greater width than the second trench; simultaneously forming insulation walls (112; 218') on sidewalls of the first trench and a solid insulating region (142; 221) in the second trench, the insulation walls defining an empty space (220) between them and the solid insulating region filling the second trench; and filling the empty space in the first trench with a conductive filling material (113; 226), thereby forming a first insulation structure (226); the insulating region in the second trench defining a second insulation structure.

Example 10. A process according to the preceding Example, wherein simultaneously forming a first and a second trench (215, 216) comprises covering the surface of the body with a mask and etching the body.

Example 11. A process according to Example 9 or 10, wherein simultaneously forming the insulation walls on sidewalls of the first trench and the solid insulating region in the second trench comprises thermally oxidizing the first and the second trenches to form a lateral wall covering the sidewalls and the bottom of the first trench and to form the solid insulating region.

Example 12. A process according to the preceding Example, further comprising, after thermally oxidizing, anisotropically etching the lateral wall and the solid insulating region, thereby removing the bottom of the lateral wall and forming slanted inlet portions at the first trench, and forming a cavity at a surface portion of the solid insulating region, with the slanted inlet portions having increasing thickness from the surface of the body toward the bottom of the first trench and the cavity having decreasing cross-section from the surface of the body toward the bottom of the second trench.

Example 13. A process according to the preceding Example, wherein filling the empty space in the first trench comprises depositing a polysilicon layer, forming the conductive filling material (113) in the first trench and the solid insulating region (231) in the second trench.

Example 14. A process according to the preceding Example, further comprising removing surface portions of the conductive layer on the surface of the body.

Example 15. A process according to any of Examples 9-14, wherein the width (CD2; W4) of the second insulation structure (140; 236) is equal or smaller than twice the thickness (T; T1) of the insulation walls.

The invention claimed is:

1. A semiconductor device, comprising:

a body of semiconductor material having a surface;

an active area in the body;

an operational region in the active area;

a first deep insulation structure extending in the active area from the surface of the body in a first trench and comprising insulation walls surrounding a conductive filling portion, the first deep insulation region having a first width and a first depth; and a second deep insulation structure extending in the active area from the surface of the body in a second trench and surrounding the operational region, the second deep insulation structure comprising a solid insulating region filling the second trench, the second deep insulation structure having a second width and a second depth, the second width being smaller than the first width and the second depth being smaller than the first depth;

wherein the insulation walls of the first deep insulation structure each have a first portion that is slanted and overlies a second portion, the first portions of the insulation walls surrounding a superficial portion of the conductive filling portion, and the second portions of the insulation walls surrounding a deep portion of the trench filling portion;

wherein the second deep insulation structure has a surface portion overlying the solid insulating region; the surface portion of the second deep insulation structure delimiting a superficial cavity accommodating a top filling portion of conductive material; and wherein the first portions of the insulation walls have a thickness which increases thickness starting from the main surface of the body and the top filling portion of the second deep insulation structure has a triangular section with a base at approximately the main surface of the body.

2. The semiconductor device according to claim 1, wherein the first deep insulation structure has a closed shape and surrounds the second deep insulation structure.

3. The semiconductor device according to claim 1, wherein the second deep insulation structure has a closed shape and the first deep insulation structure is external to the second deep insulation structure.

4. The semiconductor device according to claim 1, wherein the second deep insulation structure is contiguous to the operational region.

5. The semiconductor device according to claim 1, wherein the surface portion of the second deep insulation structure has two facing sides and each first portion of the insulation walls has approximately a same profile as one of the facing sides of surface portion of the second deep insulation structure.

6. A process for manufacturing a semiconductor device, comprising:

simultaneously forming a first trench and a second trench in a body of semiconductor material, the first and second trenches extending from a surface of the body of semiconductor material, the first trench having a greater depth and a greater width than the second trench;

simultaneously forming insulation walls on sidewalls of the first trench and a solid insulating region in the second trench, the insulation walls defining an empty space therebetween and the solid insulating region filling the second trench;

wherein simultaneously forming the insulation walls on sidewalls of the first trench and the solid insulating region in the second trench comprises thermally oxidizing the first and second trenches to form a lateral wall covering the sidewalls and the bottom of the first trench and to form the solid insulating region;

after thermally oxidizing, anisotropically etching the lateral wall and the solid insulating region, thereby removing the bottom of the lateral wall and forming slanted inlet portions at the first trench, and forming a cavity at a surface portion of the solid insulating region, with the slanted inlet portions having increasing thickness from the surface of the body toward the bottom of the first trench and the cavity having decreasing cross-section from the surface of the body toward the bottom of the second trench; and filling the empty space in the first trench with a conductive filling material; wherein the insulation walls and conductive filling material in the first trench form a first insulation structure;

wherein the solid insulating region in the second trench form a second insulation structure.

7. The process according to claim 6, wherein simultaneously forming the first trench and the second trench comprises covering the surface of the body with a mask and etching the body using the mask.

8. The process according to claim 6, wherein filling the empty space in the first trench comprises depositing a polysilicon layer, forming the conductive filling material in the first trench and the solid insulating region in the second trench.

9. The process according to claim 8, further comprising removing surface portions of the conductive layer on the surface of the body.

10. The process according to claim 6, wherein the width of the second insulation structure is equal or smaller than twice a thickness of the insulation walls.

* * * * *